US010789333B2

(12) United States Patent
Nakajima

(10) Patent No.: US 10,789,333 B2
(45) Date of Patent: Sep. 29, 2020

(54) CIRCUIT DEVICE, VIBRATION DEVICE, ELECTRONIC APPARATUS, AND VEHICLE

(71) Applicant: Seiko Epson Corporation, Tokyo (JP)

(72) Inventor: Katsuhito Nakajima, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/223,244

(22) Filed: Dec. 18, 2018

(65) Prior Publication Data

US 2019/0197085 A1      Jun. 27, 2019

(30) Foreign Application Priority Data

Dec. 21, 2017   (JP) .................................. 2017-244578

(51) Int. Cl.
| | | |
|---|---|---|
| *G06F 17/17* | (2006.01) | |
| *H03H 17/02* | (2006.01) | |
| *H03L 7/197* | (2006.01) | |
| *H03L 1/02* | (2006.01) | |

(52) U.S. Cl.
CPC ............ *G06F 17/17* (2013.01); *H03H 17/02* (2013.01); *H03H 17/028* (2013.01); *H03L 1/022* (2013.01); *H03L 7/1974* (2013.01); *H03H 2017/0298* (2013.01)

(58) Field of Classification Search
CPC .. H03H 17/02; H03H 17/028; H03H 17/1974; H03H 17/00; H03H 2017/009; G06F 17/17; H03L 1/022; H03L 1/027; H03L 7/1976
See application file for complete search history.

(56) References Cited

U.S. PATENT DOCUMENTS

2005/0110667 A1\* 5/2005 Borisavljevic ........ H03M 3/506
341/152

FOREIGN PATENT DOCUMENTS

| JP | 2002-300007 A | 10/2002 |
| JP | 2004-282612 A | 10/2004 |

\* cited by examiner

*Primary Examiner* — Jeffrey M Shin
(74) *Attorney, Agent, or Firm* — Harness, Dickey & Pierce, P.L.C.

(57) ABSTRACT

A circuit device includes a digital signal processor (DSP) that performs first up-sampling processing of up-sampling up-sampling target data having a first sampling frequency from the first sampling frequency to a second sampling frequency by first interpolation processing, and an arithmetic circuit that performs second up-sampling processing of up-sampling data output from the DSP from the second sampling frequency to a third sampling frequency by second interpolation processing.

14 Claims, 14 Drawing Sheets

CIRCUIT DEVICE, VIBRATION DEVICE, ELECTRONIC APPARATUS, AND VEHICLE

BACKGROUND

1. Technical Field

The present invention relates to a circuit device, a vibration device, an electronic apparatus, and a vehicle.

2. Related Art

In the related art, a technology of a device that converts a sampling frequency of digital data is disclosed in JP-A-2002-300007 and JP-A-2004-282612. JP-A-2002-300007 discloses a sampling frequency conversion device including an IIR type filter that limits a bandwidth of digital audio data and a polynomial interpolation unit that converts a sampling frequency of digital audio signal data into a predetermined sampling frequency by using a polynomial interpolation. JP-A-2004-282612 discloses a data processing device including first and second up-sampling circuits that up-sample a PCM signal and a linear interpolation circuit that linearly interpolates up-sampled data based on an up-sampling frequency ratio obtained by the first and second up-sampling circuits to generate the PCM signal.

In JP-A-2002-300007, since the up-sampling is performed by a single stage polynomial interpolation unit, in order to realize a high up-sampling frequency ratio, it is necessary to operate the polynomial interpolation unit at a high speed. In JP-A-2004-282612, although the up-sampling is realized by using a multistage up-sampling circuit, there is no disclosure as to what kind of hardware configuration circuit is used to realize each up-sampling circuit of multistage configuration.

In the up-sampling processing, it is possible to reduce image components (image frequency) of harmonics by performing interpolation processing with good interpolation performance such as polynomial interpolation. However, attempting to realize a complicated interpolation such as the polynomial interpolation by using a dedicated hardware circuit leads to a large-scale circuit. Meanwhile, if a digital signal processor (DSP) is used, the polynomial interpolation can be realized by using a multiplier or an adder included in the DSP, but it is difficult to operate the DSP at a high speed.

SUMMARY

An advantage of some aspects of the invention is to solve at least a part of the problems described above, and the invention can be implemented as the following forms or embodiments.

An aspect of the invention relates to a circuit device including a digital signal processor that performs first up-sampling processing of up-sampling up-sampling target data having a first sampling frequency from the first sampling frequency to a second sampling frequency by first interpolation processing, and an arithmetic circuit that performs second up-sampling processing of up-sampling data that is output from the digital signal processor from the second sampling frequency to a third sampling frequency by second interpolation processing.

According to the aspect of the invention, a sampling frequency of up-sampling target data is up-sampled from a first sampling frequency to a second sampling frequency by first up-sampling processing of a digital signal processor, and is up-sampled by second up-sampling processing of an arithmetic circuit from the second sampling frequency to a third sampling frequency. That is, the data is not up-sampled from the first sampling frequency to the third sampling frequency all at once, and is up-sampled from the first sampling frequency to the intermediate second sampling frequency by the digital signal processor, and then, is up-sampled from the second sampling frequency to the third sampling frequency by the arithmetic circuit. The first up-sampling processing by first interpolation processing can be performed by the digital signal processor that can perform even a complicated interpolation processing and can also be used for another digital signal processing. Accordingly, since the first interpolation processing can be performed by effectively using the digital signal processor used for another digital signal processing, it is possible to suppress an increase in scale of a circuit. Meanwhile, the second up-sampling processing of the second interpolation processing can be performed by an arithmetic circuit having a simpler circuit configuration and a smaller circuit scale than the digital signal processor. Accordingly, it is possible to provide a circuit device that can perform up-sampling to a high sampling frequency while suppressing an increase in scale of a circuit as a whole of the circuit device.

In the aspect of the invention, the digital signal processor may perform digital signal processing different from the first up-sampling processing, and the first up-sampling processing in a time division manner.

In this way, digital signal processing different from first up-sampling processing and the first up-sampling processing can be performed by the same digital signal processor, and thus, it is possible to suppress an increase in scale of the circuit.

In the aspect of the invention, the digital signal processor may perform digital signal compensation processing or digital filter processing as the digital signal processing different from the first up-sampling processing.

In this way, digital signal compensation processing or digital filter processing and first up-sampling processing can be performed in a time division manner by a digital signal processor, and the first up-sampling processing can be performed by effectively using a digital signal processor used for the digital signal compensation processing and the digital filter processing.

In the aspect of the invention, the digital signal processor may perform temperature compensation processing of frequency control data as the digital signal compensation processing and perform the first up-sampling processing for the frequency control data that is obtained by performing the temperature compensation processing as the up-sampling target data.

In this way, temperature compensation processing of frequency control data and the first up-sampling processing of the frequency control data obtained by performing the temperature compensation processing can be performed in a time division manner by a digital signal processor. Thus, it is possible to obtain the frequency control data for which the temperature compensation processing is performed and up-sampling is performed.

In the aspect of the invention, the up-sampling target data may be obtained by the digital signal processing.

In this way, first and second up-sampling processing is performed for data obtained by digital signal processing different from the first up-sampling processing, and a sampling frequency of the data can be up-sampled from a first sampling frequency to a third sampling frequency.

In the aspect of the invention, the digital signal processor may perform the first interpolation processing and digital filter processing for data that is obtained by the first interpolation processing, as the first up-sampling processing.

In this way, by performing first interpolation processing and digital filter processing, image components can be reduced and highly accurate up-sampling processing can be realized.

In the aspect of the invention, the first interpolation processing may be a polynomial interpolation, a linear interpolation, zero-order hold or a zero interpolation.

In this way, by performing a polynomial interpolation, a linear interpolation, zero-order hold or a zero interpolation by using a digital signal processor, a sampling frequency of up-sampling target data can be up-sampled from a first sampling frequency to a second sampling frequency.

In the aspect of the invention, the arithmetic circuit may perform a linear interpolation as the second interpolation processing of the second up-sampling processing.

In this way, as arithmetic circuit performs a linear interpolation as second interpolation processing, a circuit configuration of the arithmetic circuit can be simplified, a circuit scale can be reduced, and image components can be reduced.

In the aspect of the invention, the digital signal processor may output an interpolation calculation parameter value for the second interpolation processing. The arithmetic circuit may include a register unit that stores the interpolation arithmetic parameter value output from the digital signal processor and perform the second interpolation processing, based on the interpolation arithmetic parameter value which is stored in the register unit.

In this way, processing for obtaining an interpolation arithmetic parameter value is performed by a digital signal processor and an arithmetic circuit does not have to be performed, and thus, a configuration of the arithmetic circuit can be further simplified and a scale of the circuit can be reduced.

In the aspect of the invention, the second interpolation processing may be a linear interpolation, and the interpolation arithmetic parameter value may be an inclination parameter value of the linear interpolation.

In this way, the arithmetic circuit can perform a linear interpolation with simple processing using an inclination parameter value from a digital signal processor.

In the aspect of the invention, the arithmetic circuit may include the register unit that stores a base value of the linear interpolation and the inclination parameter value, and an integral circuit that performs integral processing based on the inclination parameter value from the register unit and addition processing based on the base value from the register unit.

In this way, an arithmetic circuit only have to perform integral processing based on an inclination parameter value and addition processing based on a base value, and thus, a configuration of the arithmetic circuit can be simplified and a scale of the circuit can be reduced.

In the aspect of the invention, the circuit device may further include an oscillation signal generation circuit that generates an oscillation signal. The up-sampling target data may be frequency control data. The oscillation signal generation circuit may generate the oscillation signal having a frequency corresponding to the frequency control data that is up-sampled by the second up-sampling processing by using a vibrator.

In this way, even in a case where a sampling frequency of frequency control data is low, the sampling frequency of the frequency control data can be up-sampled from a first sampling frequency to a third sampling frequency by a digital signal processor and an arithmetic circuit. By using up-sampled frequency control data, an oscillation signal of a frequency corresponding to the frequency control data can be generated.

In the aspect of the invention, the oscillation signal generation circuit may include a delta-sigma modulation circuit that performs delta-sigma modulation for a decimal part of the frequency control data that is up-sampled by the second up-sampling processing and outputs modulated data, an adder that adds an integer part of the frequency control data that is up-sampled by the second up-sampling processing to the modulated data from the delta-sigma modulation circuit and outputs addition result data, and a fractional N-type PLL circuit in which a frequency division ratio is set based on the addition result data from the adder and which outputs the oscillation signal having a frequency corresponding to the frequency control data.

In this way, an oscillation signal of a certain frequency according to frequency control data can be generated by a fractional N-type PLL circuit. In addition, a frequency accuracy of an oscillation signal can be improved by upsampling of a digital signal processor and an arithmetic circuit and noise shaping of a delta-sigma modulation circuit.

Another aspect of the invention relates to a vibration device including the circuit device described above and a vibrator.

Another aspect of the invention relates to an electronic apparatus including the circuit device described above.

Another aspect of the invention relates to a vehicle including the circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described in detail. The present embodiment which will described below does not unduly limit content of the invention described in the appended claims, and all the configurations which are described in the present embodiment are not indispensable as means for solving the invention.

1. Circuit Device

Figure 1:
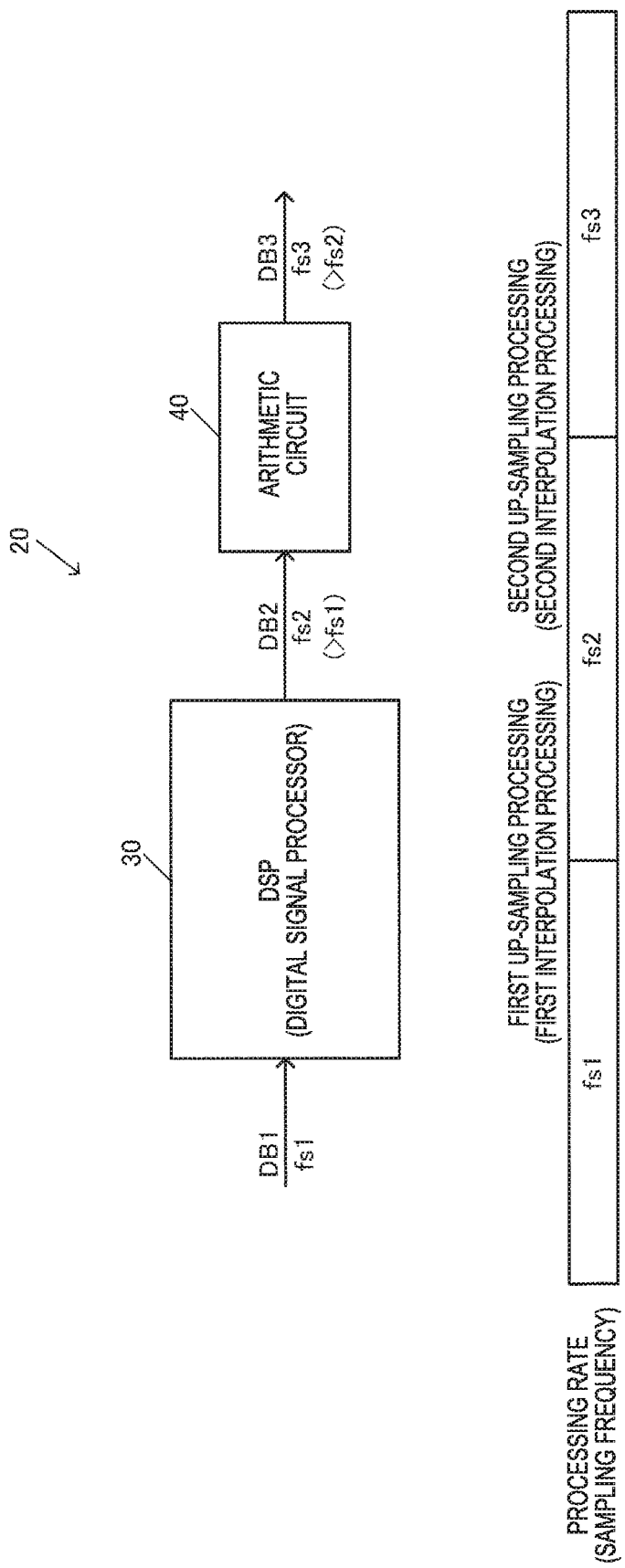
FIG. 1 is a configuration example of a circuit device according to the present embodiment.

FIG. 1 illustrates a configuration example of a circuit device 20 according to the present embodiment. The circuit device 20 includes a digital signal processor (DSP) 30 and an arithmetic circuit 40. The DSP 30 performs first up-sampling processing, and the arithmetic circuit 40 performs second up-sampling processing. Specifically, the DSP 30 up-samples data DB1 which is an up-sampling target at a sampling frequency fs1 (first sampling frequency) from the sampling frequency fs1 to a sampling frequency fs2 (second sampling frequency) through first interpolation processing. Here, a relationship of fs2>fs1 is satisfied. For example, fs2=m×fs1 (m is an integer of 2 or more). The first interpolation processing is processing of obtaining interpolation data between adjacent sampling data of the data DB1. Thereby, data DB2 of the sampling frequency fs2 higher than the sampling frequency fs1 of the data DB1 is output from the DSP 30.

The arithmetic circuit 40 up-samples the data DB2 output from the DSP 30 from the sampling frequency fs2 to sampling frequency fs3 (third sampling frequency) through second interpolation processing. Here, a relationship of fs3>fs2 is satisfied. For example, fs3=n×fs2 (n is an integer of 2 or more). The second interpolation processing is processing of obtaining interpolation data between adjacent sampling data of the data DB2. Thereby, the arithmetic circuit 40 outputs data DB3 of the sampling frequency fs3 higher than the sampling frequency fs2 of the data DB2.

In this way, the data DB1 which is an up-sampling target whose sampling frequency is fs1 is converted into the data DB3 whose sampling frequency is fs3=m×n×fs1. That is, the sampling frequency of the up-sampling target data is converted from fs1 to an intermediate frequency fs2, and is converted from fs2 to the final sampling frequency fs3. Thus, up-sampling with a high sampling frequency ratio of fs3/fs1=m×n can be realized.

The DSP 30 is, for example, a processor dedicated to digital signal processing, and performs digital arithmetic processing such as multiplication-addition arithmetic. The DSP 30 includes, for example, an arithmetic unit (multiplication-addition arithmetic unit) such as a multiplier and an adder, a register unit including a plurality of registers, and a control circuit that performs a sequence control of arithmetic. For example, the multiplier multiplies first input data by second input data and outputs multiplication result data. The adder adds the first input data to the second input data and outputs addition result data. The first and second input data, the multiplication result data, and the addition result data are held in a register of the register unit. The control circuit performs a sequence control on operations of the multiplier, the adder, and the register unit. The DSP 30 performs a plurality of times of digital signal processing in a time division manner by using an arithmetic unit such as a multiplier and an adder and a register unit. According to the DSP 30, even in complicated interpolation processing such as a polynomial interpolation with good interpolation performance, there is an advantage that an arithmetic unit such as a multiplier and an adder can be easily executed by being used in a time division manner. For example, if the complicated interpolation processing with good interpolation characteristics is performed by a dedicated hardware circuit such as the arithmetic circuit 40, many multipliers and adders are required for the hardware circuit, and the hardware circuit becomes a large-scale circuit. For example, in a case where a plurality of times of the interpolation processing such as the first and second interpolation processing is performed, a first hardware circuit for the first interpolation processing and a second hardware circuit for the second interpolation processing are separately required, which leads to a large-scale circuit. In this respect, since the DSP 30 performs the digital signal processing by using the arithmetic unit such as a multiplier and an adder in a time division manner, it is not necessary to prepare many multipliers and adders for the interpolation processing, and thus, it is possible to suppress large-scale of the circuit. For example, since the first interpolation processing for the first up-sampling processing can be performed by using the DSP 30 for other signal processing, it is possible to suppress the large-scale of the circuit device 20.

Meanwhile, the DSP 30 has the following problems. For example, data with a low sampling frequency can also be processed by the DSP 30 with a low processing speed, but in order to process data with a high sampling frequency, a high-speed DSP 30 is required. However, in order to realize the DSP 30 with a high processing speed, a fine semiconductor manufacturing processing is required, which causes a problem of high cost of the circuit device 20. If the DSP 30 is operated at a high speed, power consumption increases.

The arithmetic circuit 40 is a dedicated hardware circuit that performs the second interpolation processing in the second up-sampling processing, and can be realized by automatic placement and wiring using, for example, a gate array or a standard cell, or can be realized by a macro circuit block using manual wiring. Since the arithmetic circuit 40 is, for example, a single-function hardware circuit that performs the second interpolation processing, a circuit scale can be remarkably reduced as compared with the DSP 30. Compared with realizing the high-speed DSP 30, the high-speed arithmetic circuit 40 can be easily realized, and if data has a high sampling frequency, the data can be processed by the arithmetic circuit 40.

Therefore, in the present embodiment, up-sampling is not performed at once from the sampling frequency fs1 (for example, several hundred Hz to several tens of kHz) of the data DB1 to the final sampling frequency fs3 (for example, several MHz to several tens of MHz), and the up-sampling is first performed to the intermediate sampling frequency fs2, and thereafter the up-sampled frequency is converted into the final sampling frequency fs3 by the small-scale arithmetic circuit 40 capable of operating at a high speed. Specifically, the DSP 30 performs the first up-sampling processing for the data DB1 of the low sampling frequency fs1. In this way, it is possible to perform the first up-sampling processing even with the DSP 30 whose processing speed is not so high. It is possible to adopt complicated interpolation processing with good interpolation characteristics such as a polynomial interpolation, as the first interpolation processing performed at the time of the first up-sampling processing, and by performing the interpolation processing, it is possible to reduce image components of the harmonics. Furthermore, by operating the DSP 30 having a large circuit scale at a low speed, it is also possible to suppress an increase in power consumption.

Figure 13:
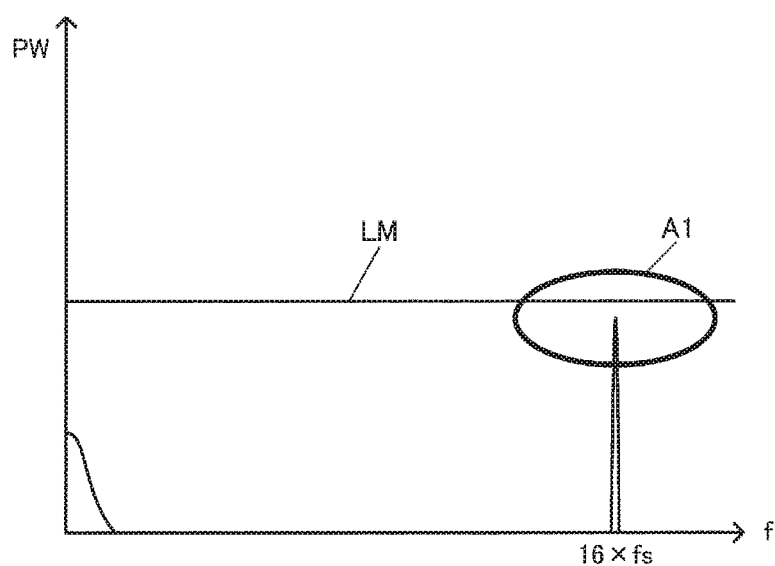
FIG. 13 is a frequency characteristic diagram of an image component in a case where the linear interpolation is performed as second interpolation processing of second up-sampling processing.

For the data DB2 of the sampling frequency fs2 increased by the first up-sampling processing of the DSP 30, the arithmetic circuit 40 capable of operating at a high speed with a small-scale circuit performs the second up-sampling processing through the second interpolation processing. Since the arithmetic circuit 40 can operate at a high speed, it is also possible to output the data DB3 of the sampling frequency fs3 higher than the sampling frequency fs2 of the data DB2. As the arithmetic circuit 40 performs the second interpolation processing such as a linear interpolation during the second up-sampling processing, it is possible to reduce the image component of harmonics. Furthermore, since the second interpolation processing such as the linear interpolation performed by the arithmetic circuit 40 is simple interpolation processing, the arithmetic circuit 40 can become a small-scale circuit, and there is an advantage that, even if the arithmetic circuit 40 is operated at a high speed, power consumption does not increase so much. The intermediate sampling frequency fs2 is set to a sampling frequency that does not deteriorate characteristics of the image component during the second interpolation processing performed by the arithmetic circuit 40 in a subsequent stage, as illustrated in FIG. 13 which will be described below.

As described above, in the present embodiment, the DSP 30 performs the first up-sampling processing for the data DB1 of the sampling frequency fs1 to output the data DB2 of the intermediate sampling frequency fs2 to the arithmetic circuit 40, and the arithmetic circuit 40 Performs the second up-sampling processing to output the data DB3 of the final sampling frequency fs3. In this way, it is possible to provide the circuit device 20 capable of reducing high-frequency image components while suppressing an increase in a circuit scale and an increase in power consumption to a minimum. That is, it is possible to perform highly accurate up-sampling to a high sampling frequency fs3 while realizing a small scale (lower power) of the circuit device 20 as a whole.

The DSP 30 performs digital signal processing different from the first up-sampling processing and the first up-sampling processing in a time division manner. Specifically, the DSP 30 performs, for example, digital signal compensation processing or digital filter processing as the digital signal processing different from the first up-sampling processing. For example, in a case where the vibration device 2 including the circuit device 20 is an oscillator illustrated in FIGS. 18 and 19 which will be described below, the digital signal compensation processing is, for example, temperature compensation processing, aging correction processing, or the like. In a case where the vibration device 2 including the circuit device 20 is a physical quantity measurement device such as a gyro sensor or the like, the digital signal compensation processing is offset correction processing such as zero point correction or gain correction processing such as sensitivity correction. The digital filter processing is, for example, low pass filter processing, high pass filter processing, band pass filter processing, band elimination filter processing, or the like. The filter processing of the DSP 30 can be realized by, for example, FIR, IIR, or the like.

Figure 2:
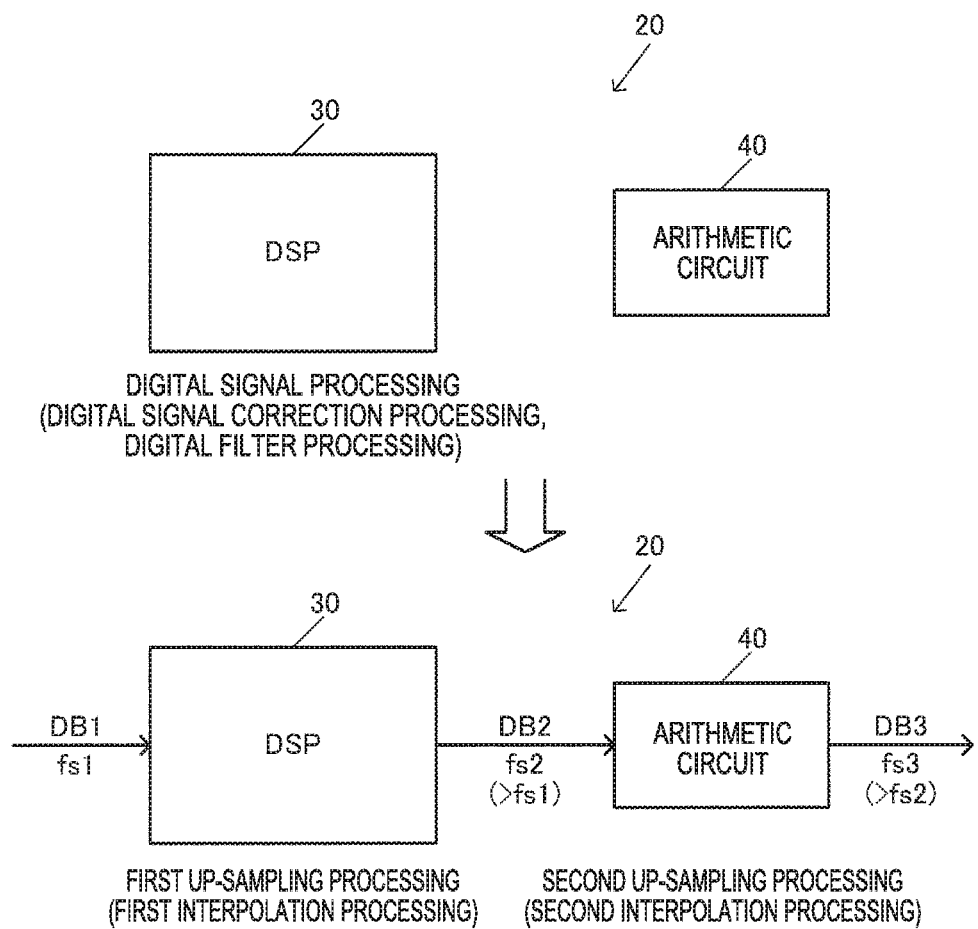
FIG. 2 is an explanatory diagram of time division processing of digital signal processing and first up-sampling processing performed by a DSP.
Figure 3:
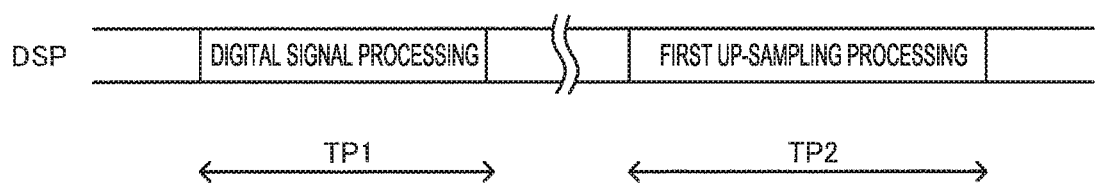
FIG. 3 is an explanatory diagram of the time division processing of the digital signal processing and the first up-sampling processing performed by the DSP.

For example, in FIG. 2, the DSP 30 performs the digital signal processing such as the digital signal compensation processing or the digital filter processing. Thereafter, the DSP 30 performs the first up-sampling processing through the first interpolation processing, for the data DB1 whose sampling frequency is fs1, and outputs the data DB2 of the sampling frequency fs2. The arithmetic circuit 40 performs the second up-sampling processing through the second interpolation processing, for the data DB2, and outputs the data DB3 of the sampling frequency fs3. That is, as illustrated in FIG. 3, the DSP 30 performs the digital signal processing such as the digital signal compensation processing or the digital filter processing during a period TP1, and performs the first up-sampling processing during a period TP2. That is, different digital signal processing is performed in a time division manner during the period TP1 and the period TP2 by using an arithmetic unit such as the same multiplier or adder.

In this way, it is possible to perform the first up-sampling processing by using the DSP 30 provided for the digital signal processing such as the digital signal compensation processing or the digital filter processing. Since the sampling frequency fs1 of the data DB1 is low (for example, several hundred Hz to several tens of kHz), the time division processing is also easily performed. Thus, both the digital signal processing different from the first up-sampling processing and the first up-sampling processing can be performed by using hardware of one DSP 30, and thereby, there is an advantage that up-sampling can be performed while suppressing an increase in a circuit scale of the circuit device 20.

Up-sampling target data processed by the DSP 30 is obtained by the digital signal processing of the DSP 30. For example, the DSP 30 performs the digital signal processing such as the digital signal compensation processing or the digital filter processing, and performs the first up-sampling processing of the data obtained by the digital signal processing as the up-sampling target data by the first interpolation processing.

Figure 4:
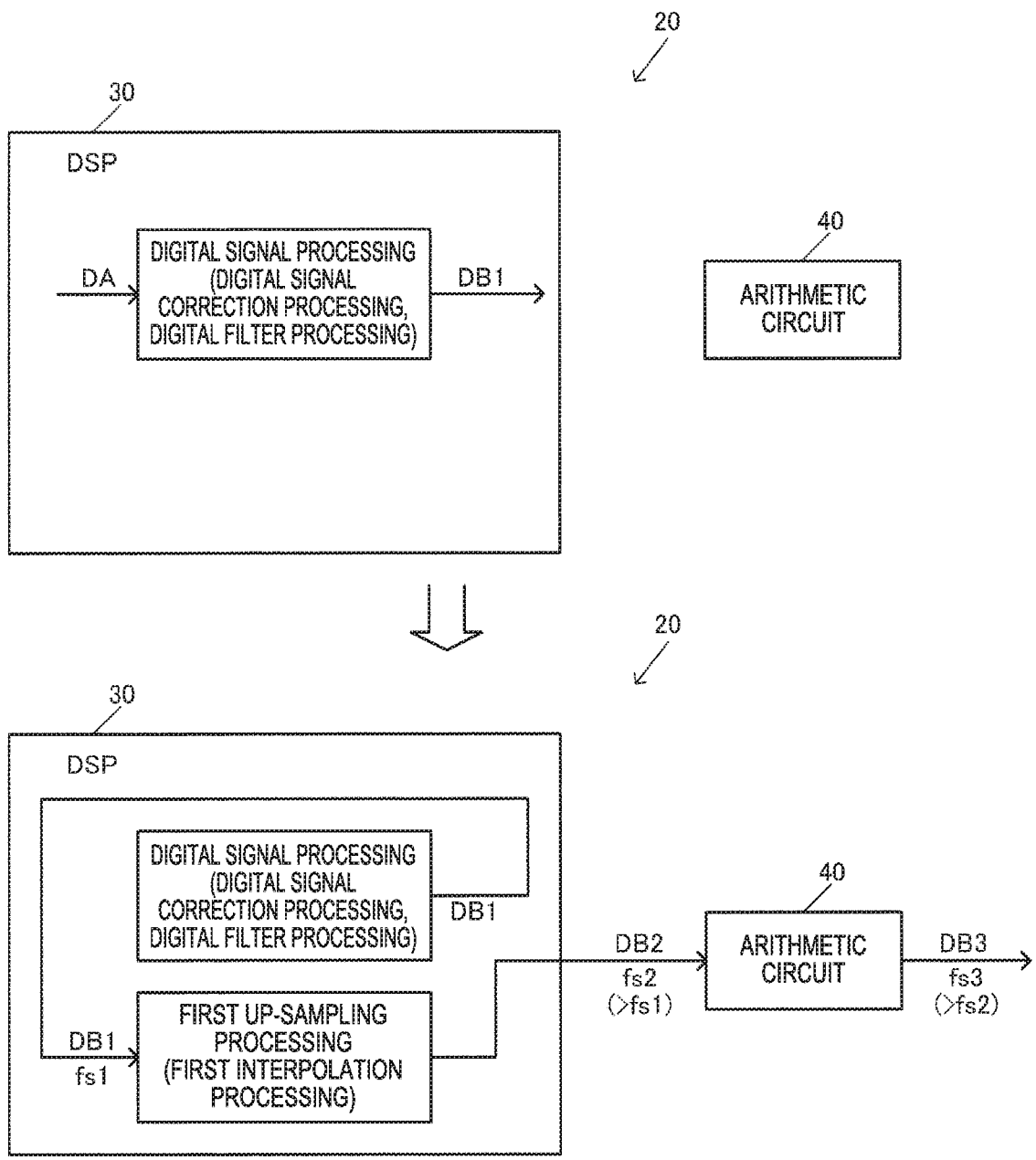
FIG. 4 is an explanatory diagram of a method of performing first up-sampling processing by using data obtained by the digital signal processing as up-sampling target data.

For example, in FIG. 4, the DSP 30 performs the digital signal processing such as the digital signal compensation processing or the digital filter processing, for data DA. Then, the DSP performs the first up-sampling processing for the data DB1 of the sampling frequency fs1 obtained by the digital signal processing, and outputs the data DB2 of the sampling frequency fs2. Then, the arithmetic circuit 40 performs the second up-sampling processing for the data DB2 and outputs the data DB3 of the sampling frequency fs3.

In this way, the time division processing of the DSP 30 is effectively utilized to perform the digital signal processing for the data DA, up-sampling is performed for the data DB1 of the sampling frequency fs1 obtained by the digital signal processing, and thereby, the data DB3 of the up-sampling frequency fs3 can be output.

Specifically, the DSP 30 performs temperature compensation processing of frequency control data as the digital signal compensation processing to perform the first up-sampling processing for the frequency control data obtained by performing the temperature compensation processing as the up-sampling target data, and the arithmetic circuit 40 performs the second up-sampling processing. Thereby, the temperature compensation processing is performed for the frequency control data, and thus, it is possible to perform up-sampling in which the sampling frequency of the frequency control data obtained by performing the temperature compensation processing is converted from fs1 to fs3.

Figure 5:
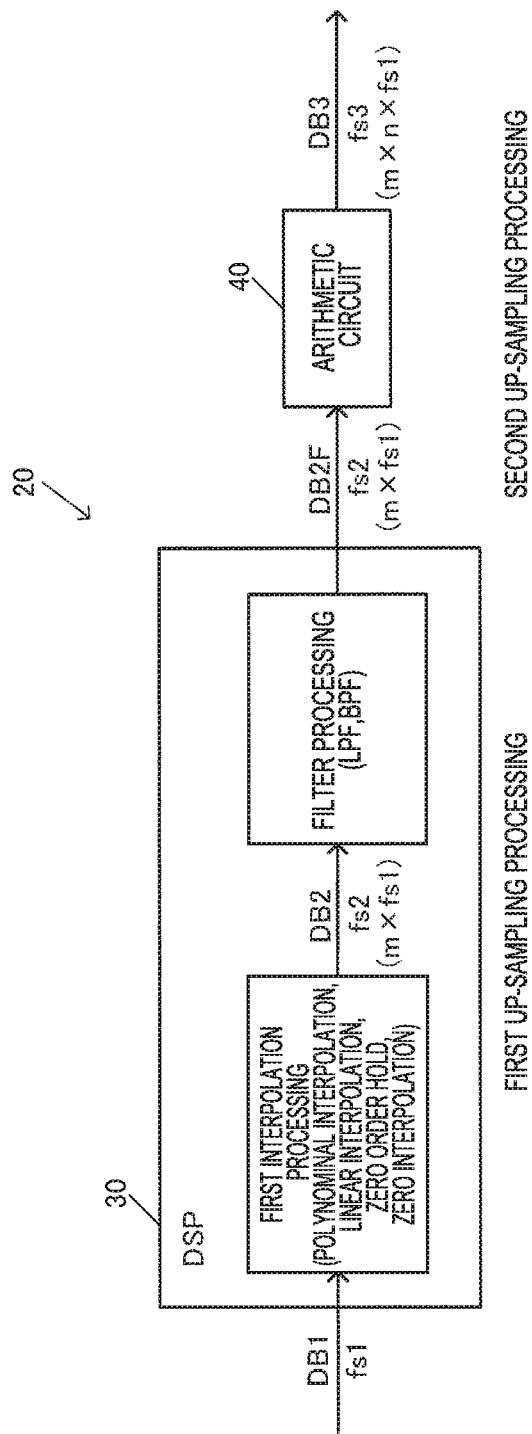
FIG. 5 is a detailed configuration example of the circuit device according to the present embodiment.

FIG. 5 illustrates a detailed configuration example of the circuit device 20 according to the present embodiment. As illustrated in FIG. 5, the DSP 30 performs the first interpolation processing and the digital filter processing for the data obtained by the first interpolation processing, as the first up-sampling processing. For example, low pass filter processing (LPF) or band pass filter processing (BPF) is performed as the digital filter processing. Specifically, for example, a primary (or secondary) low pass filter processing is performed. For example, the DSP 30 performs the first interpolation processing such as a polynomial interpolation or a linear interpolation and the digital filter processing in a time division manner in the same manner as in FIGS. 2 to 4. The digital filter processing can be realized by, for example, FIR, IIR, or the like.

Figure 17:
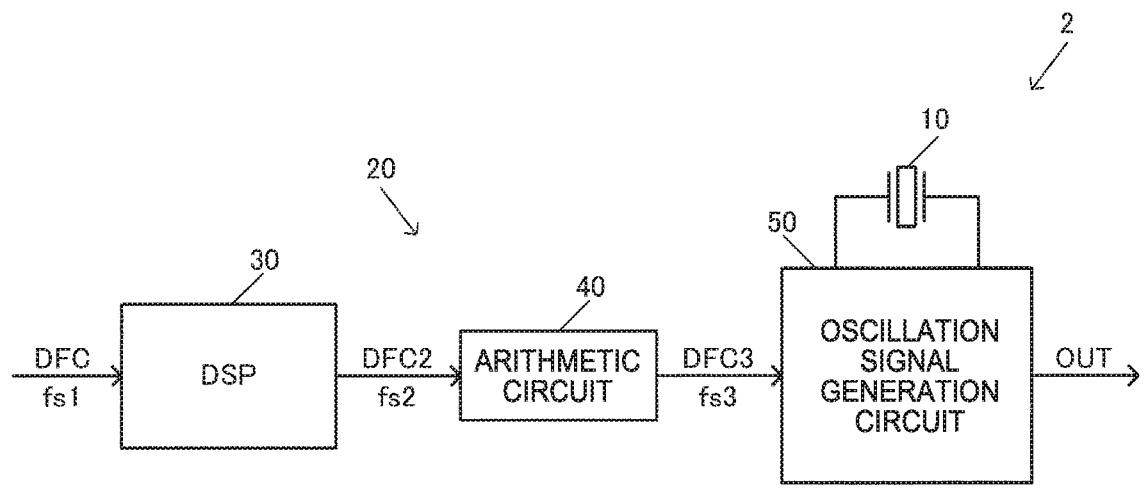
FIG. 17 is a configuration example of a circuit device including an oscillation signal generation circuit.
Figure 18:
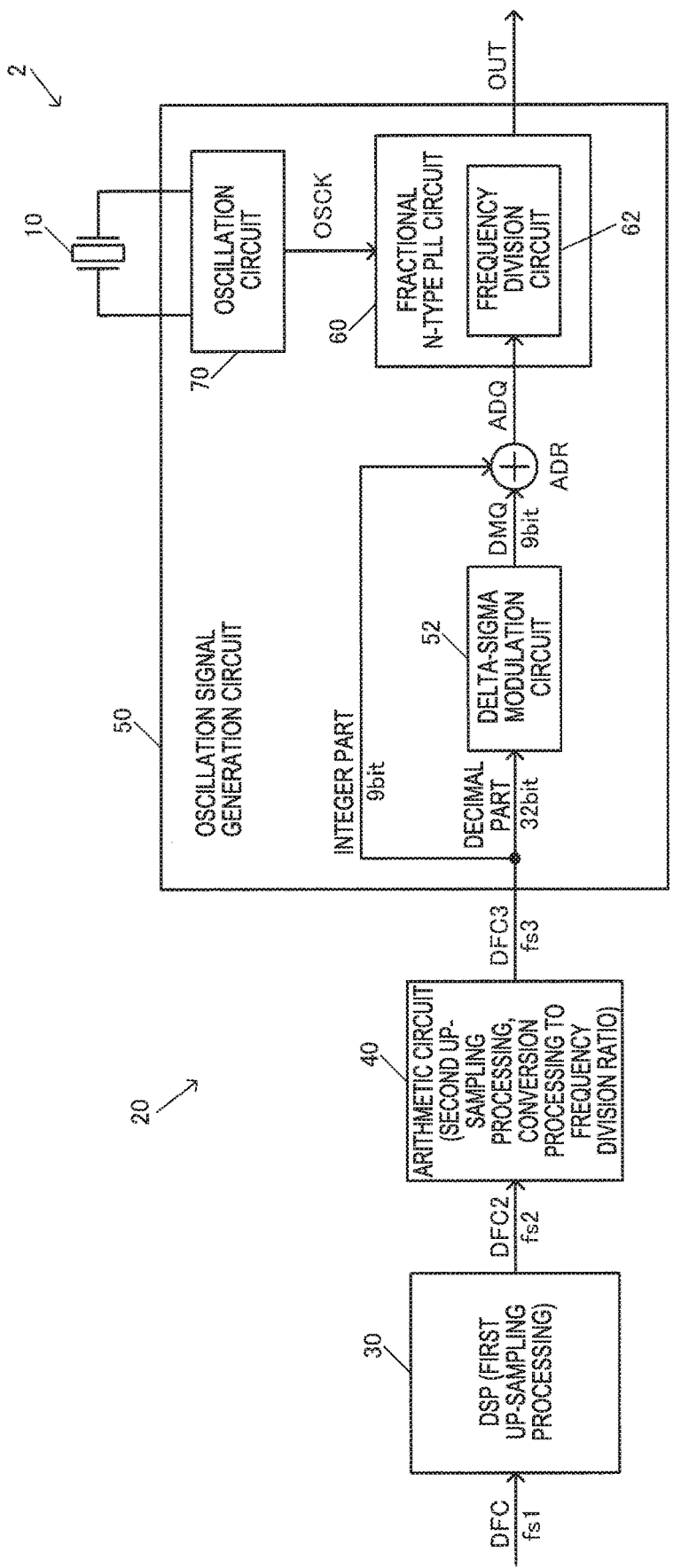
FIG. 18 is a configuration example of the oscillation signal generation circuit.
Figure 19:
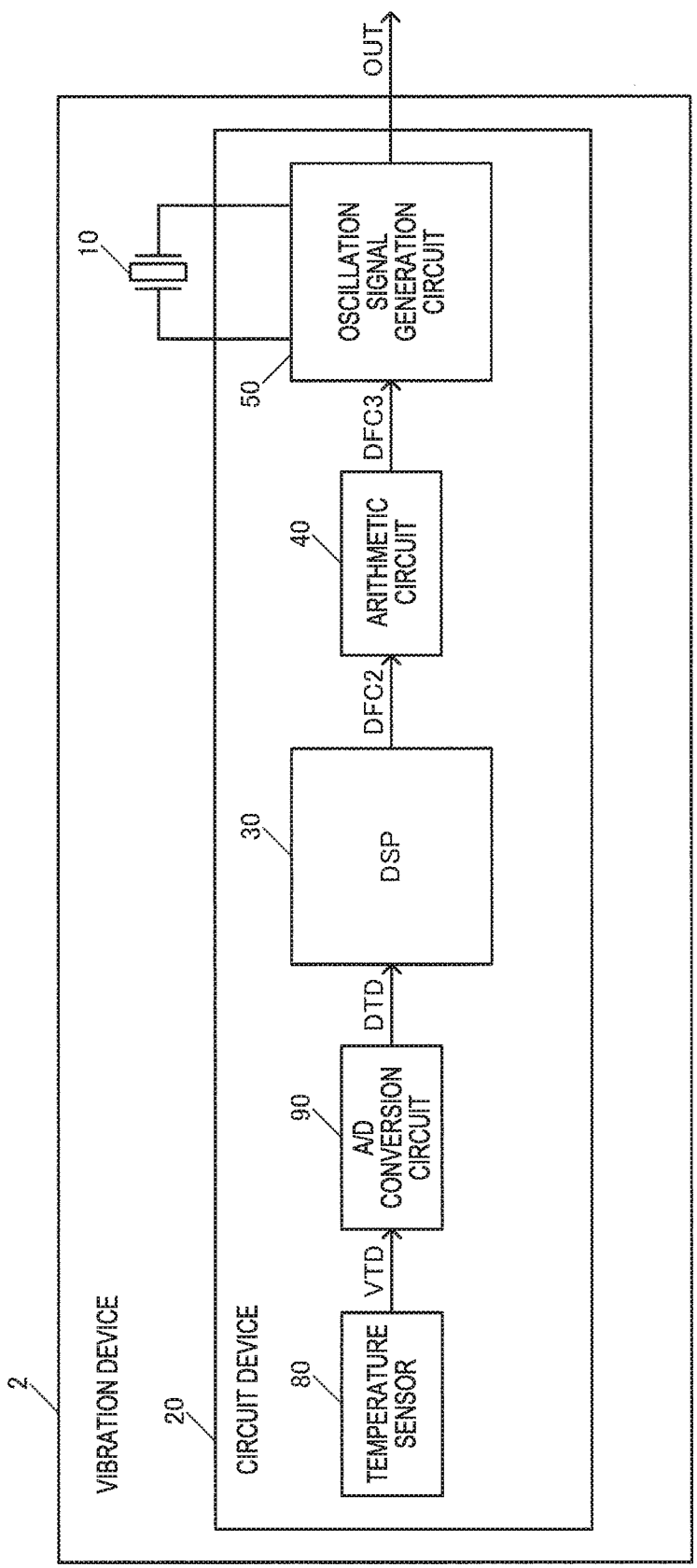
FIG. 19 is a configuration example of a vibration device.

For example, the first interpolation processing is performed for the data DB1 of the sampling frequency fs1 by the DSP 30, and the data DB2 of the sampling frequency fs2 is obtained. The filter processing such as the low pass filter processing is performed for the data DB2, and filtered data DB2F is output from the DSP 30. The arithmetic circuit 40 performs the second up-sampling processing for this data DB2F and outputs the data DB3 of the sampling frequency fs3. By performing the digital filter processing, image components of harmonics can be attenuated, and thereby, various types of processing in which the up-sampled data DB3 is used can be improved in performance. For example, in a case where a delta-sigma type D/A conversion circuit to which the up-sampled (oversampled) data DB3 is input is provided at a subsequent stage of the arithmetic circuit 40, it is possible to achieve high accuracy of a D/A conversion accuracy by performing the filter processing using the DSP 30. As illustrated in FIGS. 17 to 19 which will be described below, in a case where the data DB3 is used as frequency control data obtained by up-sampling the data DB3, it is possible to improve accuracy of an oscillation frequency of an oscillator. It is also possible to perform modification implementation in which the filter processing is performed by providing a filter circuit in the arithmetic circuit 40, without performing the filter processing using the DSP 30.

The first interpolation processing performed by the DSP 30 during the first up-sampling processing is, for example, a polynomial interpolation, a linear interpolation, a zero-order hold or a zero interpolation. The polynomial interpolation is processing of interpolating a sampling data group by using a polynomial. For example, an M-order polynomial interpolation (M is an integer of 2 or more) such as a second order polynomial interpolation, a third order polynomial interpolation, or a fourth order polynomial interpolation, a bicubic interpolation illustrated in FIG. 9 which will be described below, or the like can be used as the polynomial interpolation. The linear interpolation is processing of interpolating the sampling data group by using a linear polynomial (linear equation). For example, data of points on a straight line connecting adjacent first and second sampling points is obtained as interpolation data. In the zero-order hold, data of the first sampling point is used as the interpolation data between the adjacent first and second sampling points. The zero interpolation is processing of setting the interpolation data of the adjacent first and second sampling points to zero. In this way, by using the polynomial interpolation, the linear interpolation, the zero-order hold or the zero interpolation as the first interpolation processing of the DSP 30, optimum interpolation processing according to a required specification of attenuation of the image component can be performed.

Meanwhile, the arithmetic circuit 40 performs, for example, the linear interpolation as the second interpolation processing of the second up-sampling processing. For example, the interpolation data is obtained by performing the linear interpolation of data of the first sampling point and data of the second sampling point output from the DSP 30. In this case, as will be described below, for example, the DSP 30 outputs an interpolation arithmetic parameter value (an inclination value and a base value) for a linear interpolation (for the second interpolation processing), and the arithmetic circuit 40 performs the linear interpolation using the interpolation arithmetic parameter value, and thereby, the interpolated data is obtained. As such, by using the linear interpolation as the second interpolation processing, the operation circuit 40 can be reduced in scale.

The second interpolation processing performed by the arithmetic circuit 40 is not limited to the linear interpolation. For example, the DSP 30 may perform the first polynomial interpolation, and the arithmetic circuit 40 may perform the second polynomial interpolation which is not better than the first polynomial interpolation in interpolation characteristic but can reduce a circuit scale. For example, the DSP 30 may perform a K order polynomial interpolation, and the arithmetic circuit 40 may perform an L order polynomial interpolation (K or L is an integer that is K>L).

Figure 6:
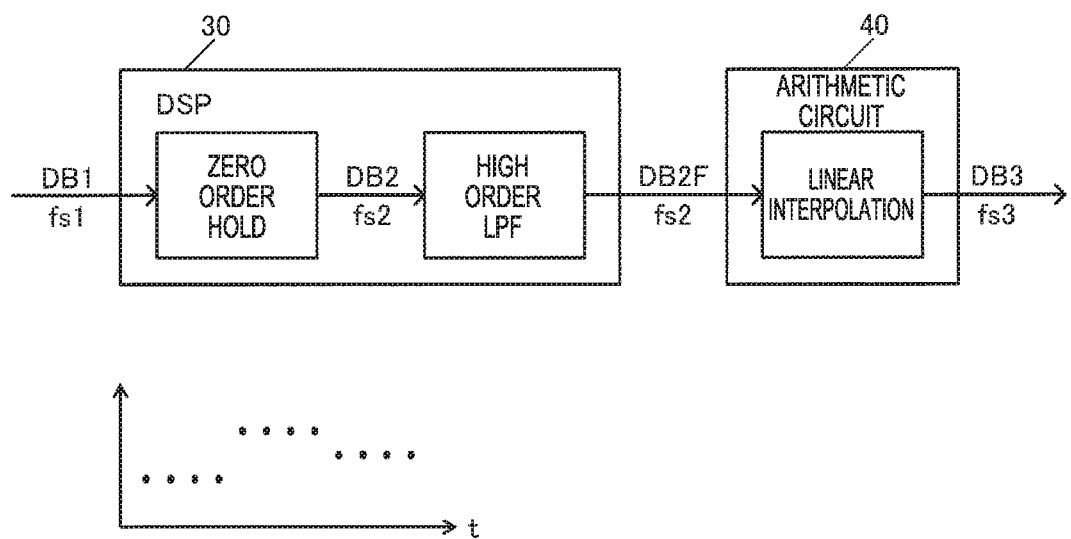
FIG. 6 is a first example of the up-sampling processing according to the present embodiment.
Figure 7:
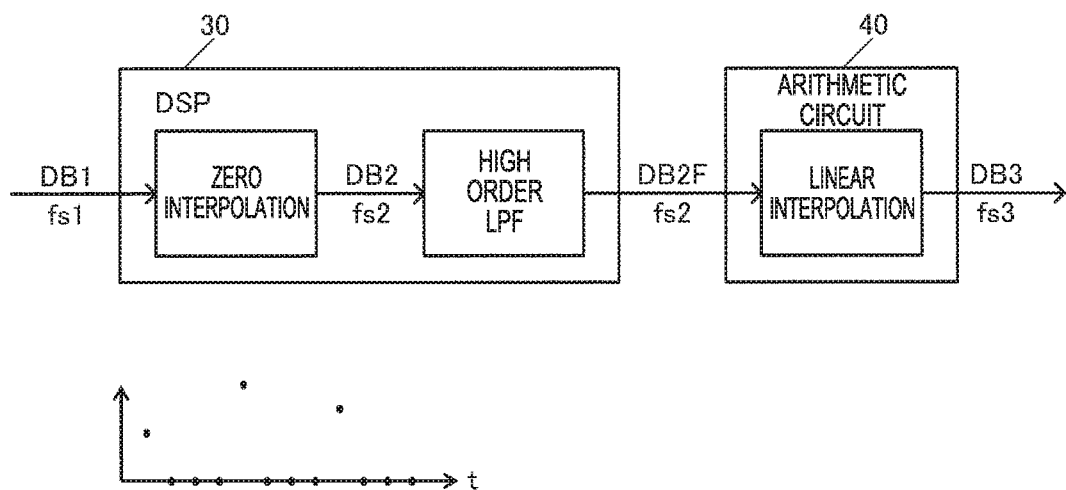
FIG. 7 is a second example of the up-sampling processing of the present embodiment.
Figure 8:
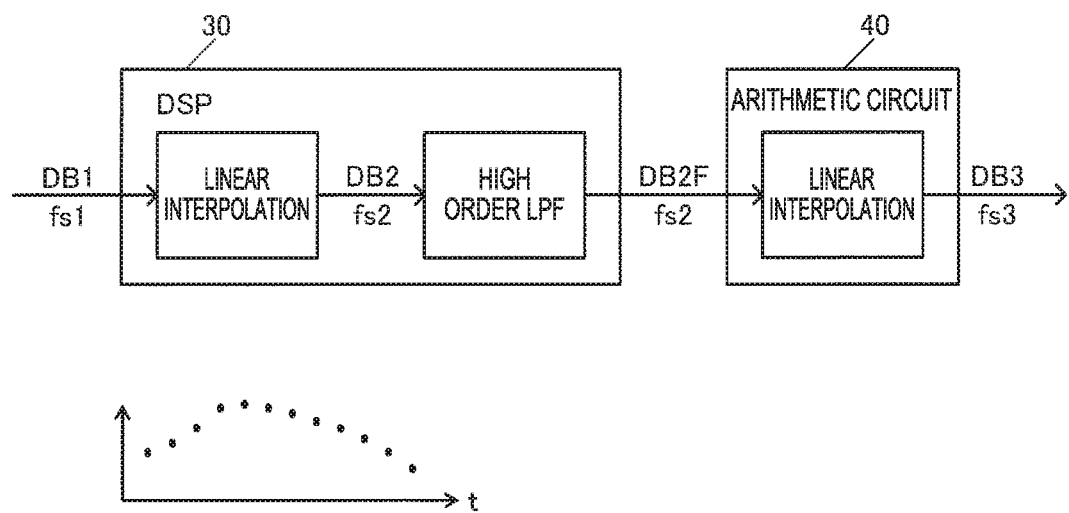
FIG. 8 is a third example of the up-sampling processing of the present embodiment.

FIGS. 6, 7, and 8 illustrate first, second, and third examples of the up-sampling processing according to the present embodiment. In the first example of FIG. 6, the DSP 30 performs the zero-order hold interpolation processing for the data DB1 of the sampling frequency fs1 and then performs high-order low pass filter processing, and outputs the data DB2F in which the sampling frequency is fs2. Then, the arithmetic circuit 40 performs the up-sampling processing by using the linear interpolation, thereby outputting the data DB3 of the sampling frequency fs3. As illustrated in FIG. 6, in the zero-order hold, previous sampling data is held and used as the interpolation data. In the second example of FIG. 7, the DSP 30 performs the zero interpolation instead of the zero-order hold of FIG. 6. As illustrated in FIG. 7, in the zero interpolation, data between adjacent sampling data is set to zero. In the third example of FIG. 8, the DSP 30 performs the linear interpolation instead of the zero-order hold of FIG. 6. As illustrated in FIG. 8, in the linear interpolation, the interpolation processing is performed by connecting the adjacent sampling data with a straight line.

Figure 9:
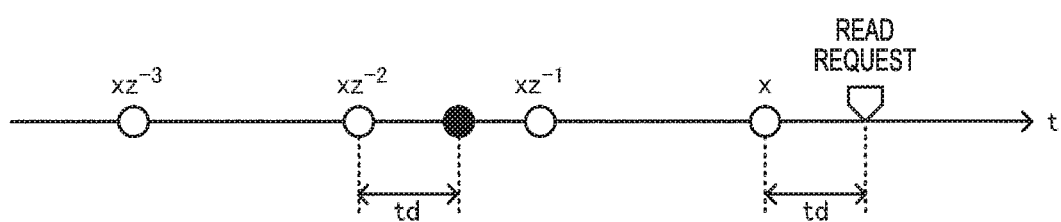
FIG. 9 is an explanatory diagram of a bicubic interpolation.

FIG. 9 is an explanatory diagram of a bicubic interpolation which is an example of the polynomial interpolation. The bicubic interpolation is interpolation processing generally used in image processing. For example, a time difference between timing when read request is made and timing when immediately preceding sampling is performed is set as td. Since four-point data is used in the bicubic interpolation, the interpolation is performed during two cycles before the timing when the read request is made. Thus, a delay occurs in the output by the time corresponding to two sampling. The interpolated data y is represented by the following equation using data x at a sampling point. In a case where d is referred to as a distance (time) from an interpolation point, h(d) is an interpolation coefficient (a function of the interpolation coefficient).

$$y=\{h(1+td)z^{-3}+h(td)z^{-2}+h(1-td)z^{-1}+h(2-td)\}\times x$$

Figure 10:
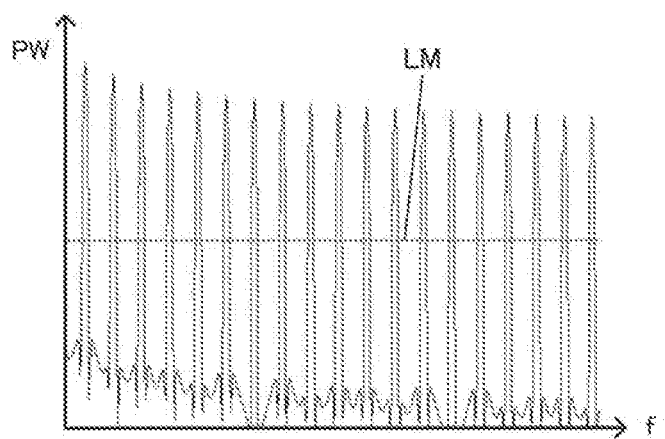
FIG. 10 is a frequency characteristic diagram of an image component in zero-order hold.
Figure 11:
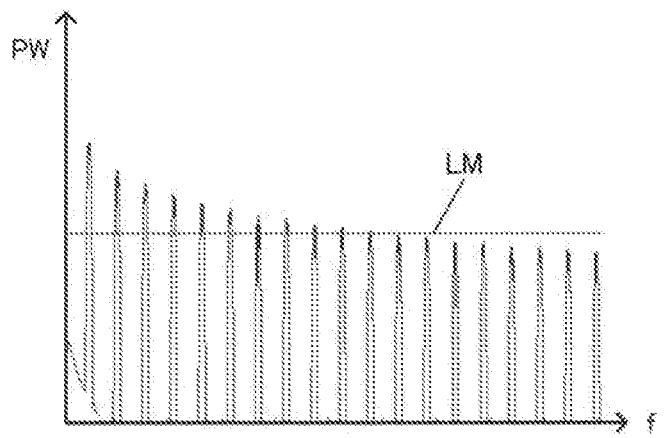
FIG. 11 is a frequency characteristic diagram of an image component in a linear interpolation.
Figure 12:
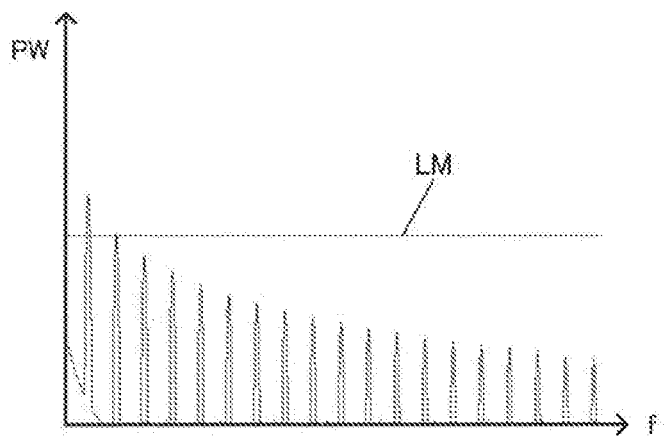
FIG. 12 is a frequency characteristic diagram of an image component in the bicubic interpolation.

Next, a problem of the image component (image frequency) at the time of up-sampling will be described. FIG. 10 is an example of frequency characteristics of the image component in a case where up-sampling is performed by using the zero-order hold. FIG. 11 is an example of the frequency characteristic of the image component in a case where the up-sampling is performed by using the linear interpolation. FIG. 12 is an example of the frequency characteristic of the image component in a case where the up-sampling is performed by using the bicubic interpolation (polynomial interpolation). Here, an AC signal whose frequency is fin is input as an input signal. The frequency fin of the input signal is, for example, 20 Hz, and the sampling frequency is, for example, fs=1 kHz. Horizontal axes in FIGS. 10, 11, and 12, denote frequencies, and vertical axes denote power of the FFT, which represent a ratio of a level of the image component to a level of the input signal.

In the up-sampling which uses the zero-order hold of FIG. 10, the image components (image frequencies) occur as, for example, fs, 2×fs, 3×fs, . . . . Actually, the image components occur as fs±fin, 2×fs±fin, 3×fs±fin, . . . . For example, in a case where the up-sampled data is input to a delta-sigma type D/A conversion circuit of 18 bits, accuracy of the 18 bits is required, and thereby, it is necessary to suppress the image component to a value lower than or equal to −110 dB corresponding to 18 bit accuracy. LMs in FIGS. 10, 11, and 12 are lines representing −110 dB.

In the up-sampling which uses the zero-order hold in FIG. 10, the image component increases from a low frequency bandwidth to a high frequency bandwidth, and exceeds the line LM. Accordingly, it is difficult to realize the 18 bit accuracy in the delta-sigma type D/A conversion circuit merely by performing the up-sampling which uses the zero-order hold. In the up-sampling which uses the linear interpolation in FIG. 11, the image component is attenuated in the high frequency bandwidth, but performance of the interpolation characteristics is insufficient. In the up-sampling which uses the bicubic interpolation in FIG. 12, the image component is attenuated over a wide frequency bandwidth, and the interpolation characteristics are comparatively good, but there is a disadvantage that a scale of a circuit that performs the interpolation processing is increased, compared with the linear interpolation in FIG. 11.

For example, in the present embodiment, the DSP performs the bicubic interpolation (polynomial interpolation in a broad sense) as first interpolation processing and the arithmetic circuit 40 performs the linear interpolation as second interpolation processing. For example, the DSP 30 performs the bicubic interpolation by effectively using a multiplier, an adder, or the like which is used for other digital signal processing, and thus, even if the DSP 30 performs the bicubic interpolation, the circuit scale is not increased. By performing the bicubic interpolation as a first interpolation processing of the first up-sampling processing, good interpolation characteristics illustrated in FIG. 12 can be obtained. Meanwhile, since the arithmetic circuit 40 performs the linear interpolation as the second interpolation processing, a circuit scale of the arithmetic circuit 40 can be reduced. Since the bicubic interpolation with a good interpolation performance is performed by the DSP 30, even if the arithmetic circuit 40 performs the linear interpolation as the second interpolation processing, the good interpolation characteristics can be maintained as a whole.

FIG. 13 is a frequency characteristics diagram of the image component in a case where the arithmetic circuit performs the linear interpolation as the second interpolation processing of the second up-sampling processing. Here, 16 times up-sampling is performed such that fs2=m×fs1=16× fs1 by the first up-sampling processing performed by the DSP 30 in a preceding stage. In this way, in a case where the linear interpolation is performed as the second interpolation processing, if the 16 times up-sampling is performed by the first up-sampling processing in the preceding stage, a level of the image component can be lowered more than a level of the line LM. In this case, what type of interpolation processing is used for the first interpolation processing is irrespective. In this way, since the level of the image component can be lowered more than the level of the line LM, it is possible to maintain the 18-bit accuracy of, for example, the delta-sigma type D/A conversion circuit. That is, the sampling frequency fs2 which is an intermediate frequency may be set to a sampling frequency in which deterioration due to the image component satisfies a predetermined requirement specification (for example, 18-bit accuracy) in a case where the arithmetic circuit 40 in a subsequent state performs the second interpolation processing such as the linear interpolation.

2. Arithmetic Circuit

Figure 14:
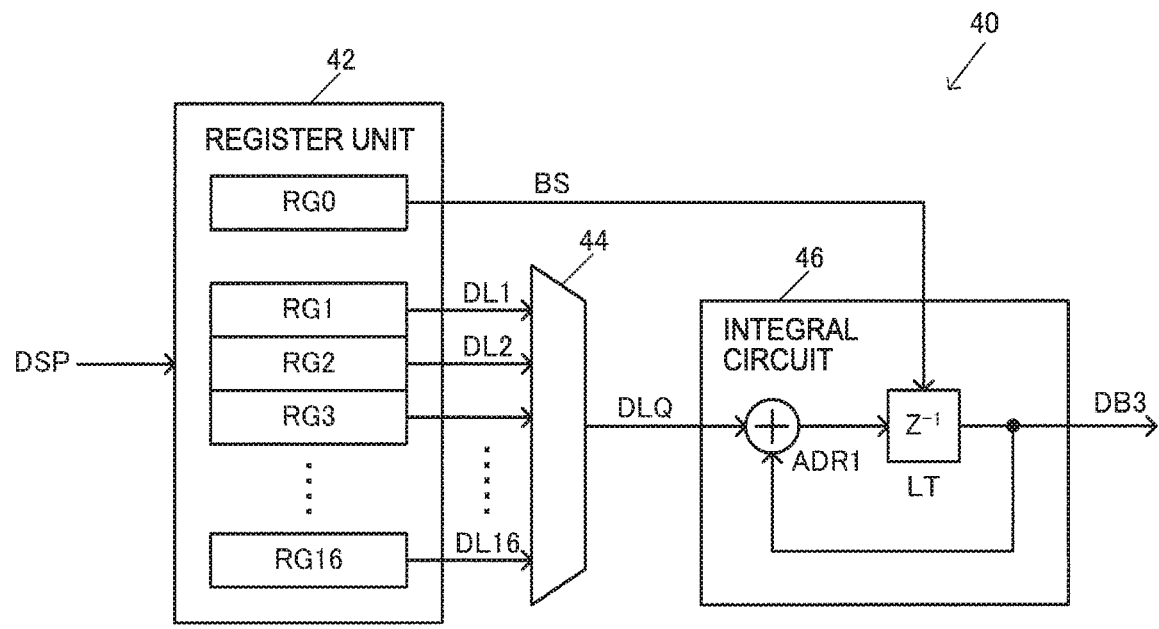
FIG. 14 is a first configuration example of an arithmetic circuit.
Figure 15:
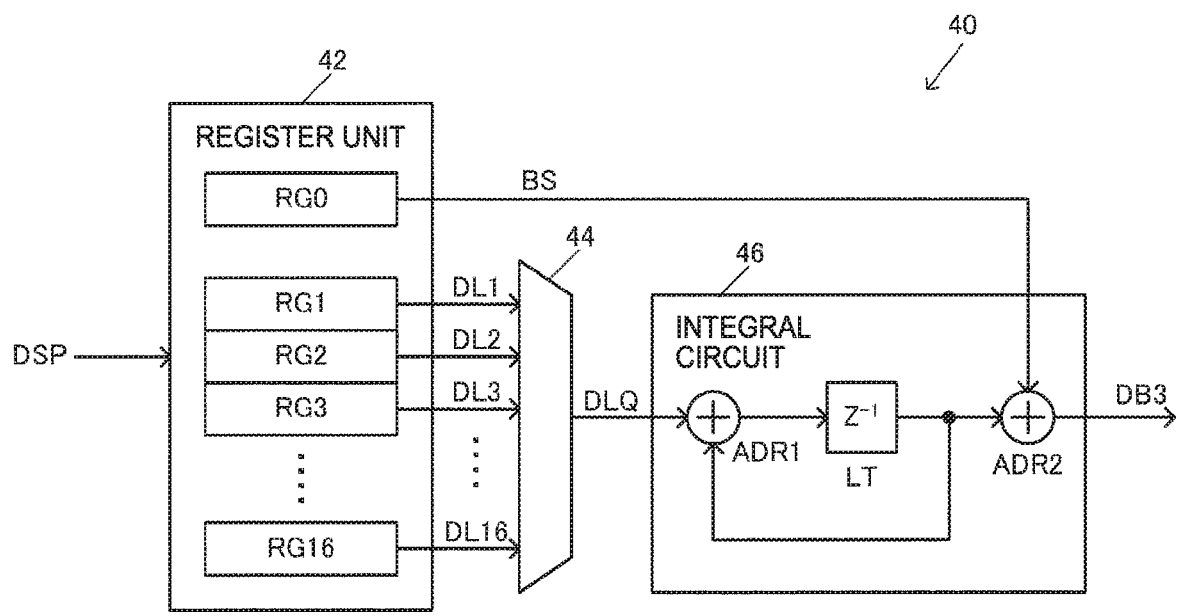
FIG. 15 is a second configuration example of an arithmetic circuit.

FIGS. 14 and 15 illustrate first and second configuration examples of the arithmetic circuit 40. In FIGS. 14 and 15, the DSP 30 outputs an interpolation calculation parameter value used for the second interpolation processing. The arithmetic circuit 40 includes a register unit 42 that stores the interpolation calculation parameter value output from the DSP 30 and performs the second interpolation processing based on the interpolation calculation parameter value stored in the register unit 42. For example, the arithmetic circuit 40 performs the linear interpolation as the second interpolation processing. For example, the DSP 30 outputs inclination parameter values DL1 to DL16 of the linear interpolation as the interpolation calculation parameter values to the arithmetic circuit 40, and registers RG1 to RG16 of the register unit 42 of the arithmetic circuit 40 store the inclination parameter values DL1 to DL16. The DSP 30 outputs a base value BS of the linear interpolation as the interpolation calculation parameter value to the arithmetic circuit 40, and the register RG0 of the register unit 42 stores the base value BS. Then, the arithmetic circuit 40 performs the linear interpolation, based on the inclination parameter values DL1 to DL16 and the base value BS stored in the register unit 42 as will be described in detail below with reference to FIG. 16.

That is, the arithmetic circuit 40 does not perform all processing of the second interpolation processing (linear interpolation), and processing of obtaining the interpolation arithmetic parameter values (DL1 to DL 16 and BS) is performed by the DSP 30. For example, the interpolation calculation parameter value is obtained by using an arithmetic unit such as a multiplier included in the DSP 30. Since the processing of obtaining the interpolation calculation parameter value can be performed by processing of an operating frequency corresponding to the sampling frequency fs2, the processing can be performed even by a low speed DSP 30. The arithmetic circuit 40 does not need to perform multiplication processing for obtaining the interpolation calculation parameter value, and thus, it is possible to reduce a scale of the arithmetic circuit 40.

As illustrated in FIGS. 14 and 15, the arithmetic circuit 40 includes the register unit 42 that stores the base value BS of the linear interpolation and the inclination parameter values DL1 to DL16, and an integral circuit 46 that performs integral processing based on the inclination parameter values DL1 to DL16 from the register unit 42 and addition processing based on the base value BS from the register unit 42. The arithmetic circuit 40 can include a selector 44 that selects one of the inclination parameter values DL1 to DL16 from the register unit 42 and outputs the selected value to the integral circuit 46.

For example, in the first configuration example of FIG. 14, the integral circuit 46 includes a latch circuit LT and an adder ADR1 that adds an inclination parameter value DLQ selected by the selector 44 to an output value of the latch circuit LT. The base value BS is set in the latch circuit LT as an initial value. Then an addition result value of the adder ADR 1 is latched by the latch circuit LT, and the latched addition result value is output from the latch circuit LT as the data DB3. In the second configuration example of FIG. 15, the integral circuit 46 includes the latch circuit LT, the adder ADR1 that adds the inclination parameter value DLQ selected by the selector 44 to the output value of the latch circuit LT, and an adder ADR2 that adds the addition result value latched in the latch circuit LT to the base value BS. Then, the addition result value of the adder ADR2 is output from the adder ADR2 as the data DB3.

According to the configurations, the arithmetic circuit 40 can perform the linear interpolation processing of the second up-sampling processing by using a simple circuit configuration which performs processing of sequentially adding the inclination parameter values obtained by the DSP 30 and integrating the added values.

Figure 16:
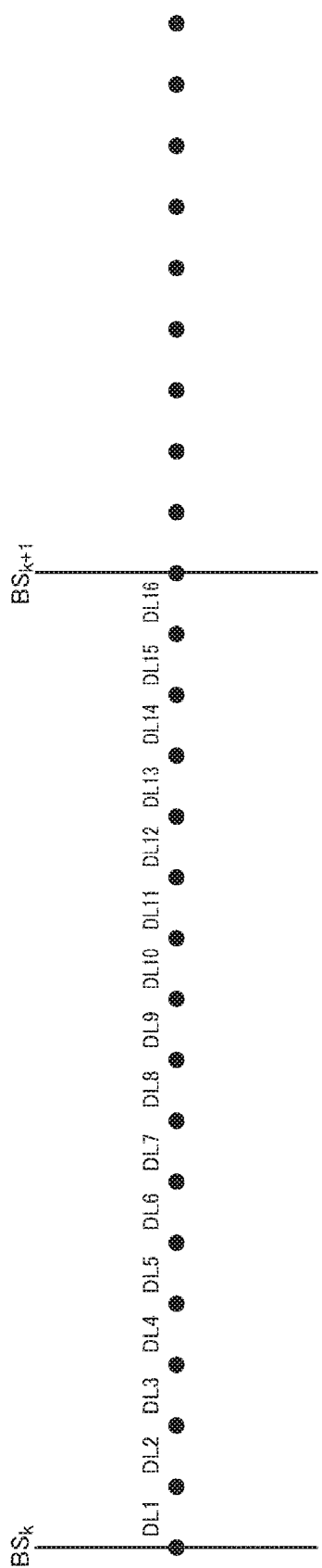
FIG. 16 is an operation explanatory diagram of the arithmetic circuit.

FIG. 16 is an operation explanatory diagram of the arithmetic circuit 40. The DSP 30 outputs base values $BS_k$ and $BS_{k+1}$ of FIG. 16 to the arithmetic circuit 40. An inclination parameter value DLn (difference value) is represented by the following equation.

$$DLn=(BS_{k+1}-BS_k)/(fs3/fs2)$$

For example, in FIG. 16, fs3=n×fs2=16×fs2, and fs3/fs2=n=16. The DSP 30 performs arithmetic processing of the above equation and outputs the inclination parameter values DLn=DL1, DL2, DL3, ..., DL16 and the base value $BS_k$ to the arithmetic circuit 40. Then, the integral circuit 46 of FIGS. 14 and 15 performs processing of sequentially adding the inclination parameter values DLn=DL1, DL2, DL3, ..., and DL16 to the base value $BS_k$ and integrating the added values. In this way, the linear interpolation performed by the arithmetic circuit 40 can be realized. For example, since the DSP 30 may perform arithmetic of the base value $BS_k$ and the inclination parameter values DLn=DL1, DL2, DL3, ..., and DL16 during a processing period of the sampling frequency fs2 which is a frequency lower than the sampling frequency fs3, a low speed DSP 30 can cope with this. Meanwhile, the processing of adding the inclination parameter value DLn to the base value $BS_k$ and integrating the added values requires a high processing speed, but the arithmetic circuit 40 which is small in circuit scale and capable of performing a high-speed operation can cope with this.

In the first configuration example of FIG. 14, the inclination parameter values DLn having a small value as compared with the base value BS are sequentially added to the base value BS ($BS_k$) which is an initial value, and thus, there is a possibility that causes a problem of information loss of the inclination parameter values DLn during, for example, a floating point arithmetic. In this respect, in the second configuration example of FIG. 15, the addition result value obtained by sequentially adding the inclination parameter values DLn is latched in the latch circuit LT, and the base value BS is added to the addition result value latched in the latch circuit LT. Accordingly, there is an advantage that the problem of information loss of the inclination parameter values DLn is hard to occur as described above.

3. Oscillation Signal Generation Circuit and Vibrating Device

FIG. 17 illustrates a configuration example of the circuit device 20 including an oscillation signal generation circuit 50. The circuit device 20 in FIG. 17 includes the DSP 30, the arithmetic circuit 40, and the oscillation signal generation circuit 50 that generates an oscillation signal OUT. In FIG. 17, the circuit device 20 and a vibrator 10 configure the vibration device 2 which is an oscillator.

In FIG. 17, frequency control data DFC of having the sampling frequency fs1 is input to the DSP 30 as up-sampling target data. The frequency control data DFC (frequency control code) is frequency control data obtained by performing temperature compensation processing which is digital signal compensation processing using the time division processing of the DSP 30 as described in FIG. 4. Then, the DSP 30 performs the first up-sampling processing for the frequency control data DFC and outputs frequency control data DFC2 having the sampling frequency fs2 to the arithmetic circuit 40. The arithmetic circuit 40 performs the second up-sampling processing for the frequency control data DFC2 and outputs frequency control data DFC3 having a sampling frequency of fs3 to the oscillation signal generation circuit 50. Then, the oscillation signal generation circuit 50 generates the oscillation signal OUT (clock signal) having a frequency corresponding to the frequency control data DFC3 up-sampled by the second up-sampling processing, using the vibrator 10.

For example, as illustrated in FIG. 19 which will be described below, a temperature sensor 80 outputs a temperature detection voltage VTD, an A/D conversion circuit 90 performs an A/D conversion of the temperature detection voltage VTD, and outputs temperature detection data DTD. The frequency control data DFC is generated based on the temperature detection data DTD. For example, the DSP 30 performs the temperature compensation processing based on the temperature detection data DTD, thereby, generating the frequency control data DFC. Specifically, the DSP 30 (temperature compensation unit) generates the frequency control data DFC obtained by performing the temperature compensation processing for reducing variation of an oscillation frequency in a case where a temperature changes, based on the temperature detection data DTD that changes depending on the temperature, coefficient data for the temperature compensation processing, and the like. Since the change in temperature is gentle, a sampling rate of the A/D conversion circuit 90 that outputs the temperature detection data DTD is also slow, and the sampling frequency of the frequency control data DFC is slow, for example fs1=1 kHz. Accordingly, it is necessary to up-sample the slow sampling frequency fs1, and in FIG. 17, up sampling from the sampling frequencies fs1 to fs3 is performed by the DSP 30 and the arithmetic circuit 40 in FIG. 17. In this way, the oscillation signal generation circuit 50 can generate the oscillation signal OUT based on the frequency control data DFC3 of the high sampling frequency fs3, and thus, it is possible to improve frequency accuracy and the like.

FIG. 18 illustrates a detailed configuration example of the oscillation signal generation circuit 50. The oscillation signal generation circuit 50 includes a delta-sigma modulation circuit 52, an adder ADR, and a fractional N-type PLL circuit 60. The oscillation signal generation circuit 50 can include an oscillation circuit 70 that oscillates the vibrator 10 to generate an oscillation signal OSCK.

The delta-sigma modulation circuit 52 performs delta-sigma modulation of a decimal part of the frequency control data DFC3 up-sampled by the second up-sampling processing, and outputs modulated data DMQ. For example, the delta-sigma modulation circuit 52 performs the delta-sigma modulation (delta-sigma conversion) of a 32-bit fractional part of the frequency control data DFC3 and outputs the modulated data DMQ of, for example, nine bits (multiple bits). Various orders such as second order and third order can be used as the order of the delta-sigma modulation. The delta-sigma modulation circuit 52 operates based on a clock signal (for example, a frequency division clock signal from a frequency division circuit 62) from, for example, the fractional N-type PLL circuit 60. Conversion processing to a frequency division ratio is performed for the frequency control data DFC3 by, for example, the arithmetic circuit 40. The adder ADR performs processing of adding an integer part of the frequency control data DFC3 to the modulation data DMQ from the delta-sigma modulation circuit 52 and outputs addition result data ADQ. For example, processing of adding a nine-bit integer part of the frequency control data DFC 3 to a nine-bit modulation data DMQ from the delta-sigma modulation circuit 52 is performed, and the addition result data ADQ is output to the fractional N-type PLL circuit 60.

The fractional N-type PLL circuit 60 sets the frequency division ratio based on the addition result data ADQ from the adder ADR, and outputs the oscillation signal OUT having a frequency corresponding to the frequency control data DFC3 (data converted to the frequency division ratio). For example, the frequency division ratio of the frequency division circuit 62 is set based on the addition result data ADQ. The fractional N-type PLL circuit 60 generates the oscillation signal OUT obtained by multiplying an oscillation signal OSCK from the oscillation circuit 70, based on the frequency division ratio set in the frequency division circuit 62. The generated oscillation signal OUT (clock signal) is output as an output signal of the vibration device 2.

Various known configurations can be adopted as the fractional N-type PLL circuit 60. For example, the fractional N-type PLL circuit 60 can include the frequency division circuit 62, a phase comparator, a charge pump circuit, a low pass filter circuit, and a voltage control oscillation circuit. For example, the phase comparator compares a phase of the oscillation signal OSCK from the oscillation circuit 70 with a phase of the frequency division clock signal from the frequency division circuit 62. The charge pump circuit is provided at a rear stage of the phase comparator, the low pass filter circuit is provided at a rear stage of the charge pump circuit, and the voltage control oscillation circuit is provided at a rear stage of the low pass filter circuit. The frequency division circuit 62 receives the oscillation signal OUT from the voltage control oscillation circuit, and outputs the frequency division clock signal (feedback signal) of the frequency division ratio set by the addition result data ADQ to the phase comparator.

According to the oscillation signal generation circuit 50 having the configuration of FIG. 18, it is possible to generate and output an oscillation signal OUT (clock signal) of a certain frequency obtained by multiplying the frequency of the oscillation signal OSCK from the oscillation circuit 70. Accordingly, the oscillation signal OUT having a certain frequency different from the oscillation frequency of the vibrator 10 can be output, and the oscillation signal OUT can be used for various purposes. For example, it is assumed that the vibrator 10 has good vibration characteristics with high accuracy at a specific frequency (for example, 10 MHz), and that a frequency different from the specific frequency is required for use of the oscillation signal OUT. Also in this case, by using the fractional N-type PLL circuit 60, the oscillation signal OUT having a certain frequency different from the specific frequency can be output, and thus, it is possible to meet the requirement. In the configuration illustrated in FIG. 18, the image component is reduced in the up-sampling performed by the DSP 30 and the arithmetic circuit 40, and the noise component is shifted to a higher frequency side by noise shaping of the delta-sigma modulation circuit 52. Thereby, it is possible to improve a frequency accuracy of the oscillation signal OUT.

FIG. 19 illustrates a specific configuration example of the vibration device 2 which is an oscillator and the circuit device 20 included in the vibration device 2. Although a case where the vibration device 2 is an oscillator is mainly described as an example in the present embodiment, the vibration device 2 may be a physical quantity measurement device that measures a physical quantity such as an angular velocity, acceleration, velocity, a distance, or time. For example, the vibration device 2 may be a gyro sensor or the like that measures an angular velocity which is a physical quantity.

The circuit device 20 in FIG. 19 includes the temperature sensor 80, the A/D conversion circuit 90, the DSP 30, the arithmetic circuit 40, and the oscillation signal generation circuit 50.

The temperature sensor 80 outputs a temperature dependent voltage that changes depending on a temperature of an environment (for example, the circuit device 20 or the vibrator 10) as a temperature detection voltage. For example, the temperature sensor 80 generates the temperature dependent voltage by using a circuit element having a temperature dependence, and outputs the temperature dependent voltage by using a temperature independent voltage (for example, a band gap reference voltage) as a reference. For example, the temperature sensor outputs a forward voltage of a PN junction as a temperature dependent voltage.

The A/D conversion circuit 90 performs an A/D conversion of the temperature detection voltage VTD from the temperature sensor 80 and outputs the converted voltage as the temperature detection data DTD. For example, a successive approximation type, a flash type, a pipeline type, a double integration type or the like can be adopted as an A/D conversion method.

The DSP 30 performs temperature compensation processing of compensating for temperature characteristic and generates frequency control data for controlling an oscillation frequency, based on the temperature detection data DTD. Specifically, the DSP 30 performs the temperature compensation processing for canceling or suppressing (keeping the oscillation frequency constant even in a case where a temperature changes) variation of an oscillation frequency due to a temperature change, based on the temperature detection data DTD (temperature dependent data) that changes depending on the temperature, coefficient data for the temperature compensation processing (data of a coefficient of an approximation function), and the like. The coefficient data for the temperature compensation processing is stored in a storage unit (not illustrated). The storage unit may be realized by a semiconductor memory such as a RAM (SRAM or DRAM), or may be realized by a nonvolatile memory. Then, as illustrated in FIGS. 17 and 18, up-sampling of the frequency control data DFC is performed by the DSP 30 and the arithmetic circuit 40 to generate the frequency control data DFC3 having the sampling frequency fs3, and the frequency control data is input to the oscillation signal generation circuit 50. The oscillation signal generation circuit 50 generates and outputs the oscillation signal OUT having a frequency corresponding to the frequency control data DFC 3 by using the vibrator 10.

According to the configuration of FIG. 19, even in a case where a sampling rate of the A/D conversion circuit 90 that outputs the temperature detection data DTD is low and the sampling frequency fs1 of the frequency control data is low (for example, several kHz), it is possible to up-sample the sampling frequency from fs1 to fs3 while the image component is sufficiently reduced by the DSP 30 and the arithmetic circuit 40. In addition, the temperature compensation processing for the frequency control data and the first up-sampling processing for the frequency control data obtained by performing the temperature compensation processing can be performed in a time division manner by using the DSP 30. Accordingly, it is unnecessary to provide a separate hardware circuit for performing the first up-sampling processing, and the circuit device 20 can be reduced in scale. In addition, since the first up-sampling processing can be realized by low-speed processing, it is possible to operate the DSP 30 at a low operation speed, thereby realizing low cost and low power consumption. Since the image component is sufficiently reduced when the sampling frequency is up-sampled, it is possible to improve the frequency accuracy of the oscillation signal OUT.

4. Electronic Apparatus and Vehicle

Figure 20:
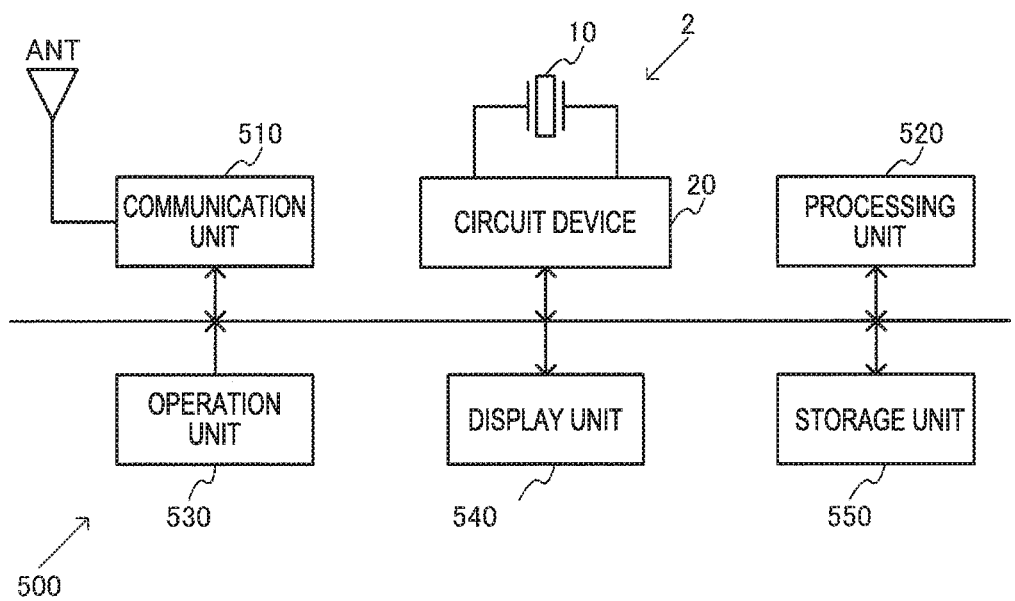
FIG. 20 is a configuration example of an electronic apparatus.

FIG. 20 illustrates a configuration example of an electronic apparatus 500 including the circuit device 20 (vibration device 2) according to the present embodiment. The electronic apparatus 500 includes the vibrator 10, the circuit device 20, and a processing unit 520. The vibrator 10 and the circuit device 20 configure the vibration device 2. The electronic apparatus 500 can include a communication unit 510, an operation unit 530, a display unit 540, a storage unit 550, and an antenna ANT.

The electronic apparatus 500 can include, for example, a network-relating apparatus such as a base station or a router, a high-accuracy measurement apparatus that measures a physical quantity such as a distance, time, a flow rate or the amount of flow, a biological information measurement apparatus that measures a biological information (an ultrasonic measurement device, a pulse wave meter, a blood pressure measurement device or the like), an in-vehicle apparatus (an apparatus for automatic drive and the like), and the like. In addition, the electronic apparatus 500 can include a wearable apparatus such as a head-mounted display device or a clock relating apparatus, a robot, a printing device, a projection device, a portable information terminal (smartphone or the like), a content providing apparatus that distributes content, an image apparatus such as a digital camera or a video camera, and the like.

The communication unit 510 (communication interface) receives data from the outside via the antenna ANT and performs processing of transmitting the data to the outside. The processing unit 520 (processor) performs control processing of the electronic apparatus 500 and various types of digital processing of the data transmitted and received via the communication unit 510. A function of the processing unit 520 can be realized by a processor such as a microcomputer. The operation unit 530 (operation interface) is for the user to perform an input operation, and can be realized by an operation button, a touch panel display, or the like. The display unit 540 displays various types of information and can be realized by a display such as liquid crystal or an organic EL. The storage unit 550 stores data, and a function thereof can be realized by a semiconductor memory such as a RAM or a ROM, a hard disk drive (HDD), or the like.

Figure 21:
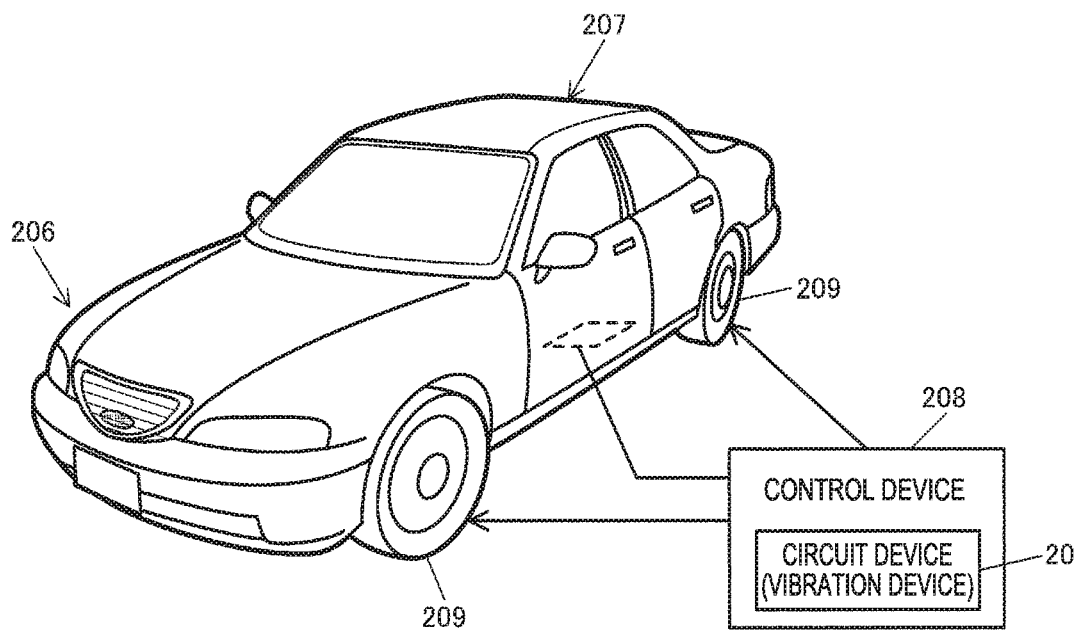
FIG. 21 is a configuration example of a vehicle.

FIG. 21 illustrates an example of a vehicle including the circuit device 20 (vibration device 2) according to the present embodiment. The circuit device 20 and the vibration device 2 (an oscillator and a physical quantity measurement device) according to the present embodiment can be incorporated into various vehicles such as a car, an airplane, a motorbike, a bicycle, a robot, a ship, and the like. The vehicle is an apparatus or a device, which moves on the ground, the sky, or the sea, including, for example, a drive mechanism such as an engine and a motor, a steering mechanism such as a steering wheel or a rudder, and various types of electronic apparatuses (in-vehicle apparatuses). FIG. 21 schematically illustrates an automobile 206 as a specific example of the vehicle. The circuit device 20 or the vibration device 2 including the circuit device 20 according to the present embodiment is incorporated into the automobile 206. A control device 208 performs various types of control processes based on a clock signal generated by the vibration device 2 including the circuit device 20 and the measured physical quantity information. For example, in a case where distance information of an object around the automobile 206 is measured as physical quantity information, the control device 208 performs various types of control processing for automatic drive using the measured distance information. For example, the control device 208 controls hardness of a suspension according to a posture of a vehicle body 207 and controls brakes of each wheel 209. An apparatus into which the circuit device 20 and the vibration device 2 according to the present embodiment is incorporated is not limited to the control device 208 and can be incorporated into various apparatuses provided in a vehicle such as the automobile 206 or a robot.

Although the present embodiment is described in detail as above, it will be easily understood by those skilled in the art that many modifications can be made without practically departing from novel matters and effects of the invention. Accordingly, all the modification examples are included in the scope of the invention. For example, in the specification or the drawings, a term (bicubic interpolation or the like) described together with a different term (polynomial interpolation or the like) in a broader sense or synonym at least once can be replaced with a different term anywhere in the specification or drawings. In addition, all combinations of the present embodiment and modification examples are included in the scope of the invention. In addition, processing such as the configurations and operations of a circuit device, a vibration device, an electronic apparatus, and a vehicle, the first and second up-sampling processing, and the first and second interpolation processing are also not limited to those described in the present embodiment, and various modifications can be made.

The entire disclosure of Japanese Patent Application No. 2017-244578, filed Dec. 21, 2017 is expressly incorporated by reference herein.

What is claimed is:

1. A circuit device comprising:
    a digital signal processor that performs first up-sampling processing of up-sampling up-sampling target data, having a first sampling frequency, from the first sampling frequency to a second sampling frequency by first interpolation processing; and
    an arithmetic circuit that performs second up-sampling processing of up-sampling data, outputted from the digital signal processor, from the second sampling frequency to a third sampling frequency by second interpolation processing, wherein the digital signal processor performs digital signal processing different from the first up-sampling processing, and performs the first up-sampling processing in a time division manner, wherein the digital signal processor performs digital signal compensation processing or digital filter processing as the digital signal processing different from the first up-sampling processing, and wherein the digital signal processor performs temperature compensation processing of frequency control data as the digital signal compensation processing and performs the first up-sampling processing for the frequency control data that is obtained by performing the temperature compensation processing as the up-sampling target data.

2. The circuit device according to claim 1,
wherein the up-sampling target data is obtained by the digital signal processing.

3. The circuit device according to claim 1,
wherein the digital signal processor performs the first interpolation processing and digital filter processing for data that is obtained by the first interpolation processing, as the first up-sampling processing.

4. The circuit device according to claim 1,
wherein the first interpolation processing is a polynomial interpolation, a linear interpolation, zero-order hold or a zero interpolation.

5. The circuit device according to claim 1,
wherein the arithmetic circuit performs a linear interpolation as the second interpolation processing of the second up-sampling processing.

6. The circuit device according to claim 1,
wherein the digital signal processor outputs an interpolation arithmetic parameter value for the second interpolation processing, and
wherein the arithmetic circuit includes a register unit that stores the interpolation arithmetic parameter value that is output from the digital signal processor and performs the second interpolation processing, based on the interpolation arithmetic parameter value which is stored in the register unit.

7. A vibration device comprising:
the circuit device according to claim 1; and
a vibrator.

8. An electronic apparatus comprising:
the circuit device according to claim 1.

9. A vehicle comprising:
the circuit device according to claim 1.

10. A circuit device comprising:
a digital signal processor that performs first up-sampling processing of up-sampling up-sampling target data, having a first sampling frequency, from the first sampling frequency to a second sampling frequency by first interpolation processing; and
an arithmetic circuit that performs second up-sampling processing of up-sampling data, outputted from the digital signal processor, from the second sampling frequency to a third sampling frequency by second interpolation processing, wherein the digital signal processor outputs an interpolation arithmetic parameter value for the second interpolation processing, wherein the arithmetic circuit includes a register unit that stores the interpolation arithmetic parameter value that is output from the digital signal processor and performs the second interpolation processing, based on the interpolation arithmetic parameter value which is stored in the register unit, and wherein the second interpolation processing is a linear interpolation, and the interpolation arithmetic parameter value is an inclination parameter value of the linear interpolation.

11. The circuit device according to claim 10,
wherein the arithmetic circuit includes the register unit that stores a base value of the linear interpolation and the inclination parameter value, and an integral circuit that performs integral processing based on the inclination parameter value from the register unit and addition processing based on the base value from the register unit.

12. A circuit device comprising:
a digital signal processor that performs first up-sampling processing of up-sampling up-sampling target data, having a first sampling frequency, from the first sampling frequency to a second sampling frequency by first interpolation processing;
an arithmetic circuit that performs second up-sampling processing of up-sampling data, outputted from the digital signal processor, from the second sampling frequency to a third sampling frequency by second interpolation processing;
an oscillation signal generation circuit that generates an oscillation signal, wherein the up-sampling target data is frequency control data, and wherein the oscillation signal generation circuit generates the oscillation signal having a frequency corresponding to the frequency control data that is up-sampled by the second up-sampling processing by using a vibrator.

13. The circuit device according to claim 12,
wherein the oscillation signal generation circuit includes
a delta-sigma modulation circuit that performs delta-sigma modulation for a decimal part of the frequency control data that is up-sampled by the second up-sampling processing and outputs modulated data,
an adder that adds an integer part of the frequency control data that is up-sampled by the second up-sampling processing to the modulated data from the delta-sigma modulation circuit and outputs addition result data, and
a fractional N-type PLL circuit in which a frequency division ratio is set based on the addition result data from the adder and which outputs the oscillation signal having a frequency corresponding to the frequency control data.

14. A vibration device comprising:
the circuit device according to claim 12; and
the vibrator.

* * * * *